(12) United States Patent
Cohen et al.

(10) Patent No.: US 8,692,229 B2
(45) Date of Patent: Apr. 8, 2014

(54) REPLACEMENT CONTACTS FOR ALL-AROUND CONTACTS

(75) Inventors: Guy M. Cohen, Mohegan Lake, NY (US); Michael A. Guillorn, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/558,532

(22) Filed: Jul. 26, 2012

(65) Prior Publication Data

US 2014/0014904 A1   Jan. 16, 2014

Related U.S. Application Data

(63) Continuation of application No. 13/547,142, filed on Jul. 12, 2012.

(51) Int. Cl.
*H01L 29/06* (2006.01)
*H01L 31/00* (2006.01)

(52) U.S. Cl.
USPC ............. 257/24; 438/148; 438/174; 438/234; 438/675; 438/287

(58) Field of Classification Search
USPC ............. 257/24; 438/148, 174, 234, 675, 287, 438/301
See application file for complete search history.

(56) References Cited

U.S. PATENT DOCUMENTS

2007/0045725 A1* 3/2007 Yun et al. ................. 257/330
2011/0095267 A1* 4/2011 Bryant et al. ............. 257/24
2012/0161247 A1* 6/2012 Yun et al. ................. 257/401
2012/0273955 A1* 11/2012 Or-Bach et al. ........... 257/762
2013/0119557 A1* 5/2013 Or-Bach .................... 257/774

OTHER PUBLICATIONS

D.K. Schroder, "Semiconductor Material and Device Characterization," 2nd Ed., John Wiley & sons, 1998, p. 150.
K.I. Bolotin et al. "Ultrahigh electron mobility in suspended graphene," Solid State Communications, vol. 146, Jun. 2008, pp. 351-355.
Ming-Wei Lin et al., "Room-temperature high on/off ratio in suspended graphene nanoribbon field-effect transistors," Nanotechnology 22 (2011) 265201.
Kuroki et al., "Characterization of Photosensitive Low-k Films Using Electron-Beam Lithography," Electrochem. Soc., 152, G281 (2005), DOI:10.1149/1.1867632.
Kuroki et al., "Photosensitive Porous Low-K Interlayer Dielectric Film," Proc. SPIE 5592, 170 (2005), DOI:10.1117/12.570753.
Liou et al., "Effect of curing temperature on the mechanical properties of hydrogen silsesquioxane thin films," Thin Solid Films 335, pp. 186-191 (1998).

* cited by examiner

*Primary Examiner* — Telly Green
(74) *Attorney, Agent, or Firm* — Louis J. Percello; Michael J. Chang, LLC

(57) ABSTRACT

In one aspect, a FET device is provided. The FET device includes a substrate; a semiconductor material on the substrate; at least one gate on the substrate surrounding a portion of the semiconductor material that serves as a channel region of the device, wherein portions of the semiconductor material extending out from the gate serve as source and drain regions of the device, and wherein the source and drain regions of the device are displaced from the substrate; a planarizing dielectric on the device covering the gate and the semiconductor material; and contacts which extend through the planarizing dielectric and surround the source and drain regions of the device.

15 Claims, 10 Drawing Sheets

A1-A2 CROSS-SECTION

US 8,692,229 B2

REPLACEMENT CONTACTS FOR ALL-AROUND CONTACTS

CROSS-REFERENCE TO RELATED APPLICATION(S)

This application is a continuation of U.S. application Ser. No. 13/547,142 filed on Jul. 12, 2012, the disclosure of which is incorporated by reference herein.

FIELD OF THE INVENTION

The present invention relates to contact formation in electronic devices, and more particularly, to techniques for forming all-around contacts in electronic devices wherein the source and drain regions are displaced from a substrate surface, such as in the case of a nanowire field-effect transistor (FET) device.

BACKGROUND OF THE INVENTION

Field effect transistors (FETs) typically include a source region, a drain region and a channel region interconnecting the source region and the drain region. A gate regulates current flow through the channel. In the case of a nanowire FET, the channel region is made up of one or more nanowire channels.

With a conventional gate-all-around nanowire FET, the gate line defines the channel region and the portion of the nanowire extending from the gate forms the device source or drain. Contacts to the source and drain are typically done by forming a silicide over the nanowire. To obtain high circuit densities both the gate length and the spacing between adjacent gates (also referred to as pitch) have to be minimized. As a result the contact length is limited to the spacing between gates. Current transfer from a semiconductor to the contact (as is the case from the nanowire source or drain to the silicide over the nanowire) can be characterized based on transfer length $L_T$ which is the distance over which most of the current transfers from the semiconductor into the contact (or vice-aversa). See for example, D. K. Schroder, "Semiconductor Material and Device Characterization," 2nd Ed., John Wiley & sons, 1998, pg. 150 (hereinafter "Schroder"). As illustrated in Schroder, decreasing the length of the contact will introduce an unacceptable amount of resistance. Accordingly, with a conventional source and drain contact scheme, the contact length needs to be at least as long as the transfer length $L_T$. This requirement puts a limit on how small the length of the source or drain can be and therefore limits the device pitch.

Therefore, fabrication processes which permit source and drain contact scaling without violating this transfer length $L_T$ limitation would be desirable.

SUMMARY OF THE INVENTION

The present invention provides techniques for forming all-around contacts in electronic devices wherein the source and drain regions are displaced from a substrate surface, such as in the case of a nanowire field-effect transistor (FET) device. In one aspect of the invention, a method of forming contacts to source and drain regions in a FET device wherein the source and drain regions of the device are displaced from an underlying substrate is provided. The method includes the following steps. A patternable dielectric is deposited onto the device so as to surround each of the source and drain regions of the device. The patternable dielectric is exposed (e.g., by e-beam through an electronic mask layout stored in a computer's memory or by light through a physical mask that covers all but portions of the patternable dielectric that surround the source and drain regions of the device) to cross-link the portions of the patternable dielectric that surround the source and drain regions of the device, resulting in cross-linked portions of the patternable dielectric and uncross-linked portions of the patternable dielectric. The uncross-linked portions of the patternable dielectric are selectively removed relative to the cross-linked portions of the patternable dielectric, wherein the cross-linked portions of the patternable dielectric form dummy contacts that surround the source and drain regions of the device. A planarizing dielectric is deposited onto the device around the dummy contacts. The dummy contacts are selectively removed relative to the planarizing dielectric to form vias in the planarizing dielectric that surround the source and drain regions of the device. The vias are filled with at least one metal so as to form replacement contacts that surround the source and drain regions of the device.

In another aspect of the invention, a FET device is provided. The FET device includes a substrate; a semiconductor material on the substrate; at least one gate on the substrate surrounding a portion of the semiconductor material that serves as a channel region of the device, wherein portions of the semiconductor material extending out from the gate serve as source and drain regions of the device, and wherein the source and drain regions of the device are displaced from the substrate; a planarizing dielectric on the device covering the gate and the semiconductor material; and contacts which extend through the planarizing dielectric and surround the source and drain regions of the device.

A more complete understanding of the present invention, as well as further features and advantages of the present invention, will be obtained by reference to the following detailed description and drawings.

DETAILED DESCRIPTION OF PREFERRED EMBODIMENTS

Figure 1:
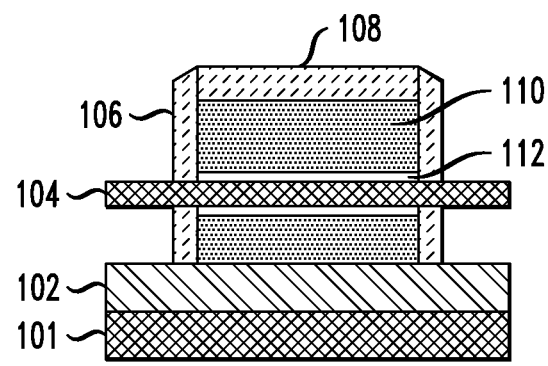
FIG. 1 is a cross-sectional diagram illustrating an exemplary starting structure for the present source and drain contact formation process according to an embodiment of the present invention.

As provided above, with conventional fabrication techniques the density of field effect transistor (FET) devices that can be formed on a given wafer is limited by the current transfer to/from the source and drain contacts to the semiconductor channel region. With conventional fabrication techniques, this means that the length of the contact has to be at least as long as the transfer length $L_T$ which is the distance over which most of the current transfers from the semiconductor into the metal (or vice-a-versa). See for example, D. K. Schroder, "Semiconductor Material and Device Characterization," 2nd Ed., John Wiley & sons, 1998, pg. 150 (hereinafter "Schroder"), the contents of which are incorporated by reference herein. Advantageously, with the present techniques, an all-around source/drain contact scheme is provided which increases the overall effective source and drain contact length (i.e., the contacts are made to the top, bottom and possibly the sidewalls of the source and drain region). Thus, an increase of the contact length by at least a factor of two is achieved without increasing the device-to-device pitch.

The present techniques are now described by way of reference to FIGS. 1-15. The process begins with a gate electrode (or multiple gate electrodes in the case where multiple devices are being formed, see FIGS. 16 and 17, described below) surrounding a portion(s) of a semiconductor material that will serve as a channel region of the device. Portions of the semiconductor material that extend out from the gate electrode(s) will serves as source and drain regions of the device. According to the present techniques, the source and drain regions are suspended (also referred to herein as displaced from) an underlying substrate. By displaced it is meant that the source and drain regions are not in direct physical contact with the underlying substrate (i.e., a space separates the source and drain regions from the underlying substrate). This is in contrast for example with configurations where the source and drain regions are in direct physical contact with the underlying substrate. By way of example only, the underlying substrate may include a glass, metal, plastic, semiconductor, etc. wafer and an insulator layer (e.g., an oxide layer) over the wafer on which the device is fabricated.

By way of example only, suitable techniques for forming the above-described starting structure for the present contact fabrication process are described, for example, in U.S. patent application Ser. No. 13/344,352 filed by Cohen et al., entitled "Compressive (PFET) and Tensile (NFET) Channel Strain in Nanowire FETs Fabricated with a Replacement Gate Process" (hereinafter "Cohen"), the contents of which are incorporated by reference herein. It is notable that in Cohen, multiple devices are formed (as will be described in detail below). Further, Cohen involves the formation of nanowire-based FETs (i.e., wherein the semiconductor material is semiconducting nanowires). While the following description will highlight embodiments wherein nanowire FETs are formed, it is to be understood that the present techniques are more generally applicable to any device structure where the source and drain regions are displaced/suspended over the underlying substrate. While the present process is essentially the same for all such devices, any processing deviations from a nanowire-based architecture will be highlighted in the description below. By way of example only, other applicable device structures might employ other semiconducting materials to form the channel source and drain, such as, but not limited to, graphene, silicon carbide and a III-V semiconductor, such as InGaAs. Suitable exemplary graphene-based device structures are described in K. I. Bolotin et al. "Ultra-high electron mobility in suspended graphene," Solid State Communications, Volume 146, June 2008, Pages 351-355, and Ming-Wei Lin et al., "Room-temperature high on/off ratio in suspended graphene nanoribbon field-effect transistors," Nanotechnology 22 (2011) 265201, the contents of each of which are incorporated by reference herein.

Figure 5:
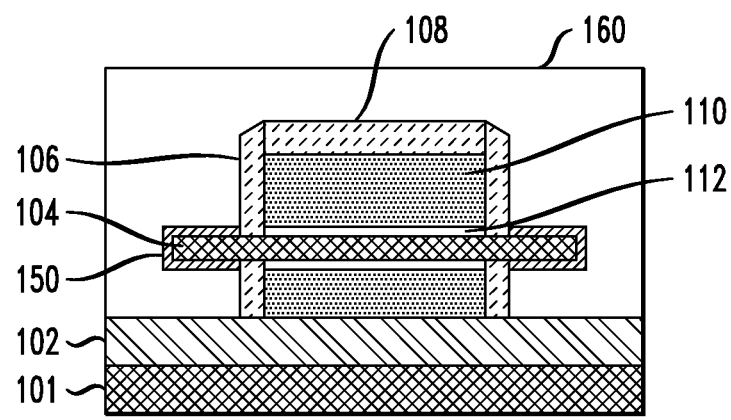
FIG. 5 is a cross-sectional diagram illustrating a patternable dielectric having been deposited onto the structure surrounding the source and drain regions according to an embodiment of the present invention.

By way of reference, for example, to FIG. 5 of Cohen, a device structure is shown having a plurality of gates surrounding a plurality of nanowire channels. Pads are attached at opposite ends of the nanowire channels in a ladder-like configuration, permitting the nanowires to be suspended over an underlying buried oxide (BOX) and substrate. The details for fabricating this structure (including suspending the nanowires by undercutting the BOX and/or by thinning/reshaping the nanowires using an anneal in an inert gas environment) are described in Cohen, and as highlighted above, that description is incorporated by reference as fully set forth herein. The gates in that example fully surround each of the nanowire channels. This is also referred to herein as a gate-all-around (GAA) configuration.

FIG. 1 is a cross-sectional diagram illustrating an exemplary starting structure for the present contact formation techniques. The structure shown in FIG. 1 is generally representative of any type of a device wherein the source and drain regions (i.e., the portions of the semiconductor material that extend out from the gate) are displaced from the underlying substrate). However, as will be apparent from reference to the top-view of the device shown in FIG. 2 (described below), FIG. 1 is in fact a cross-sectional cut through line A1-A2 of a nanowire FET device. Accordingly, for consistency, FIG. 1 will now be described in terms of a nanowire FET device. It is also notable that FIG. 1 may represent only one of multiple devices that may be formed, e.g., side by side on a wafer (see FIGS. 16 and 17, described below).

As shown in FIG. 1, the semiconductor material (in this example a silicon (Si) nanowire 104) is surrounded by a gate conductor (also referred to herein simply as a gate 110). The gate 110 may be a metal gate (formed from a metal or combination of metals) or a doped polysilicon gate. As described above, the gate surrounds a portion(s) of the nanowire(s) that serve(s) as the channel region of the device. In this example, the gate 110 is separated from the channel region by a gate dielectric 112 (e.g., an oxide such as silicon dioxide). The platform for the device is a substrate 101 (e.g., a Si substrate) beneath a BOX 102. For instance, fabrication may begin with a silicon-on-insulator (SOI) wafer having a SOI layer separated from the substrate 101 by the BOX 102. The nanowires 104 can be patterned in the SOI layer, and the BOX can be recessed under the nanowires 104 and/or the nanowires 104 can be thinned/reshaped to form the resulting structure shown in FIG. 1. See, for example, Cohen.

Spacers 106 are present on opposite sides of the gate 110. Spacers 106 (e.g., nitride spacers) serve to offset the source and drain regions from the channel. A (e.g., nitride) cap 108 may be present on top of the gate 110 to protect the gate 110 during subsequent processing steps.

Figure 2:
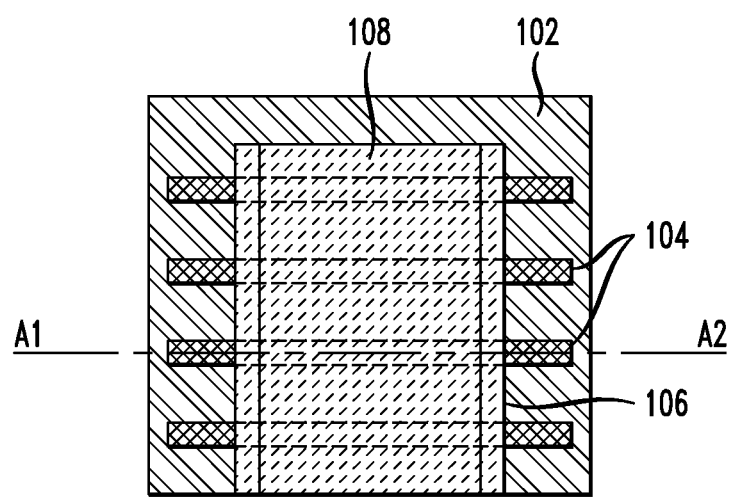
FIG. 2 is a top-down diagram illustrating the exemplary starting structure of FIG. 1 according to an embodiment of the present invention.
Figure 3:
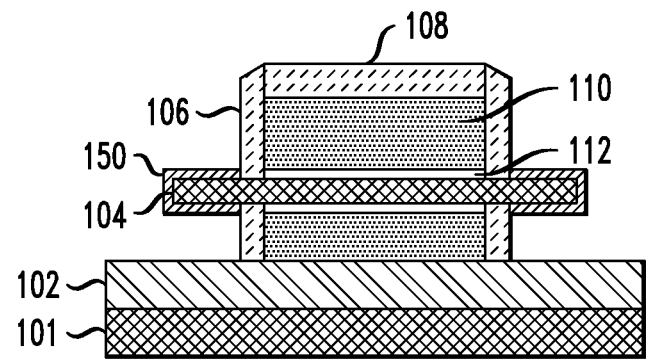
FIG. 3 is a cross-sectional diagram illustrating an optional silicide having been formed to source and drain regions of the device according to an embodiment of the present invention.

FIG. 2 is a top-down diagram of the structure in FIG. 1. Reference to FIG. 2 indicates that in this example the device being formed is a nanowire FET, and that FIG. 1 depicts a cross-sectional cut along line A1-A2, through one of the nanowire channels. FIG. 2 also indicates that, as described above, multiple nanowires 104 are present and that the gate 110 (present beneath cap 108) surrounds a channel region of each of the nanowires 104.

Figure 4:
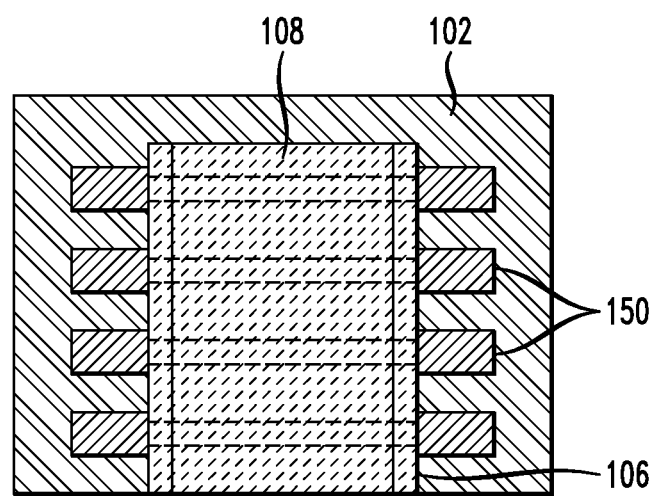
FIG. 4 is a top-down diagram illustrating the silicided structure of FIG. 3 according to an embodiment of the present invention.

Optionally, a silicide 150 is formed on the source and drain regions (i.e., the portions of the semiconductor material extending out from the gate 110). See FIG. 3. This step is considered optional since, while silicide serves to decrease the contact resistance to the source and drain regions and thus is desirable, the formation of a silicide is not an option with all possible semiconductor materials. Namely, when the semiconductor material employed is silicon (as in the example shown) then silicidation can be performed. As is known in the art, silicide involves the reaction of silicon with electropositive elements such as metals, e.g., nickel in the case of nickel silicide. An equivalent to silicidation, however, is not known when the semiconductor material is, for instance, graphene (see above). Thus, this step is considered optional in the present process. FIG. 4 is a top-down diagram illustrating the silicided structure of FIG. 3.

To begin the present contact fabrication process, a patternable dielectric 160 is deposited onto the structure surrounding the source and drain regions. According to an exemplary embodiment, the patternable dielectric is hydrogen silsesquioxane (HSQ), which can be blanket deposited over the wafer using a spin-coating process. Other suitable patternable dielectrics, such as methyl-silsesquioxane (MSQ) may be used in the same manner. See, for example, Kuroki et al., "Characterization of Photosensitive Low-k Films Using Electron-Beam Lithography," Electrochem. Soc., 152, G281 (2005), DOI:10.1149/1.1867632 and Kuroki et al., "Photosensitive Porous Low-K Interlayer Dielectric Film," Proc. SPIE 5592, 170 (2005), DOI:10.1117/12.570753, the contents of each of which are incorporated by reference herein.

The term "patternable dielectric," as used herein refers to a material that can be directly patterned using, for example, electron-beam (e-beam) lithography or optical lithography. By contrast, with conventional photolithography approaches a resist material is first patterned and the pattern is then transferred to the underlying material. Here, the patternable dielectric acts as the resist and is directly patterned using e-beam or optical lithography.

Figure 6:
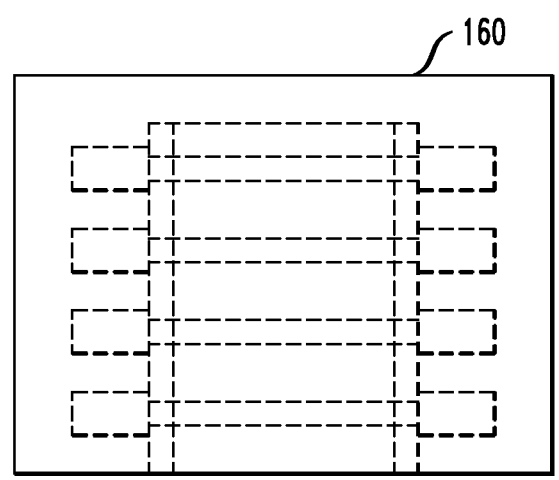
FIG. 6 is a top-down diagram illustrating the structure of FIG. 5 according to an embodiment of the present invention.

FIG. 6 is a top-down diagram illustrating the structure of FIG. 5. The structures underlying the patternable dielectric 160 are shown with dashed lines.

Figure 7:
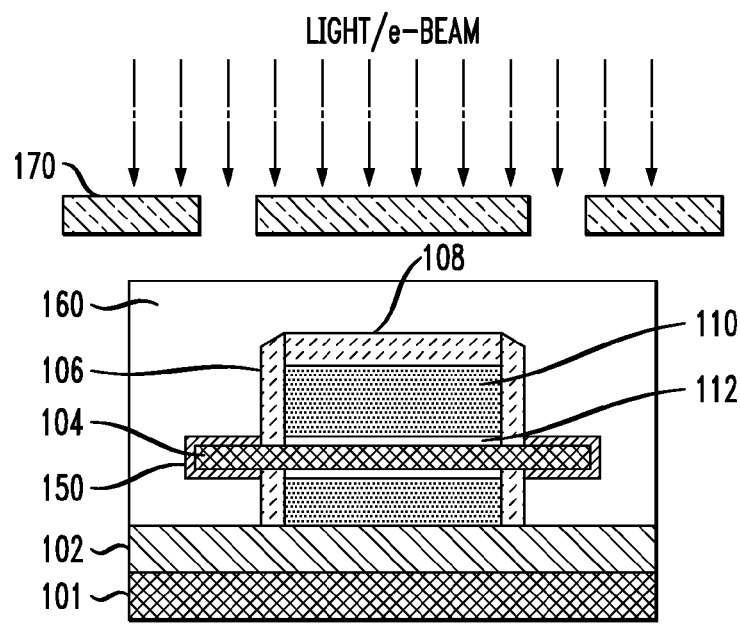
FIG. 7 is a cross-sectional diagram illustrating a photomask having been formed on the patternable dielectric according to an embodiment of the present invention.

Next, in order to enable selective exposure of the patternable dielectric 160 in the source and drain regions of the device, a photomask 170 is formed on the patternable dielectric 160. See FIG. 7. According to an exemplary embodiment, photomask 170 is formed by depositing a film such as chromium (Cr) on a glass mask and patterning the Cr. The photomask 170 is aligned to the wafer prior to exposure. When e-beam exposure is used "photomask" 170 is a computer program that controls the location where an electron beam exposes the patternable dielectric 160 (i.e., as compared to light exposure, with e-beam exposure there is no physical mask—the e-beam exposure location is guided by a computer program that "reads" an electronic mask layout stored in the computer's memory). As shown in FIG. 7, photomask 170 has openings over the source and drain regions of the device. This will permit exposure of portions of the patternable dielectric surrounding the source and drain regions.

FIG. 7 illustrates e-beam or light (see above) introduced through photomask 170 being used to cross-link the exposed portions of the patternable dielectric 160 (i.e., those portions of the patternable dielectric not masked by the photomask 170—those portions of the patternable dielectric 160 surrounding the source and drain regions).

Figure 8:
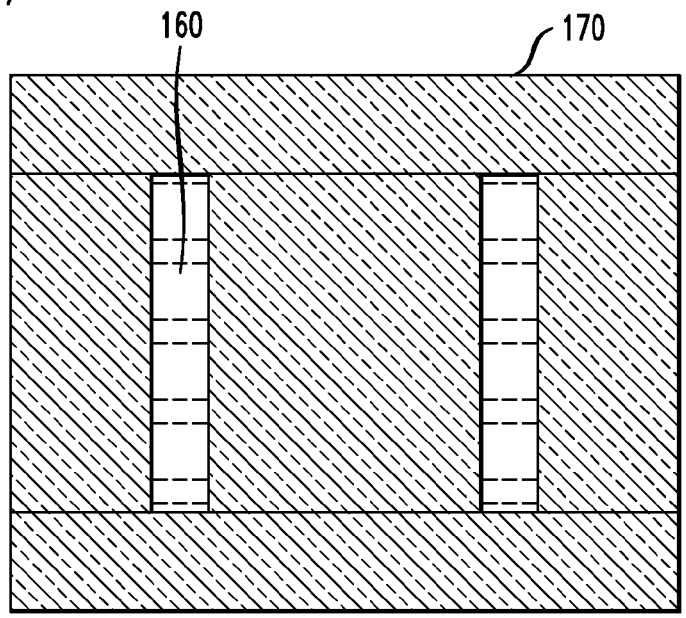
FIG. 8 is a top-down diagram illustrating the structure of FIG. 7 according to an embodiment of the present invention.

FIG. 8 is a top-down diagram illustrating the structure of FIG. 7. As shown in FIG. 8, portions of the patternable dielectric 160 (i.e., those portions of the patternable dielectric 160 surrounding the source and drain regions) are visible through the photomask 170. Following the exposure, the photomask may be removed.

Figure 9:
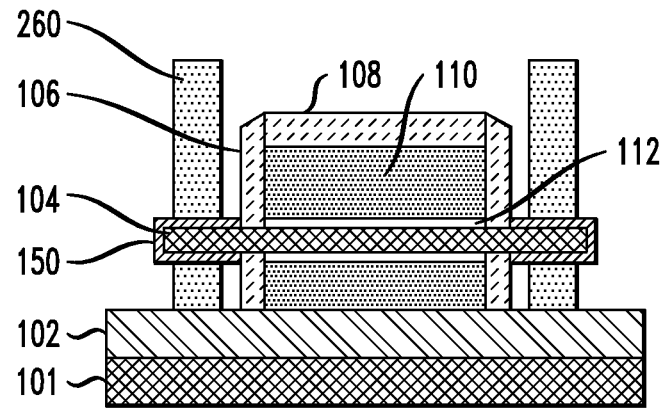
FIG. 9 is a cross-sectional diagram illustrating unexposed portions of the patternable dielectric having been selectively removed resulting in cross-linked dielectric surrounding the source and drain regions of the device according to an embodiment of the present invention.

Next, unexposed portions of the patternable dielectric (not cross-linked) can then be selectively removed using a developer wash (such as a Tetramethyl-ammonium hydroxide (TMAH) based developer or a salt based developer such as an aqueous mixture of sodium hydroxide (NaOH) alkali and sodium chloride (NaCl) salt) resulting in cross-linked dielectric surrounding the source and drain regions of the device. This cross-linked dielectric is also referred to herein as "dummy contacts" since they will be removed later in the process and replaced with "replacement contacts." Thus, the dummy contacts serve as a space holder for the replacement contacts. The structure with the cross-linked dielectric or dummy contacts 260 having been formed is shown in FIG. 9.

Advantageously, with the present process the semiconductor material (for example graphene or as in this example the nanowires 104) are transparent to the e-beam/light used to cross-link the patternable dielectric 160. Namely, the semiconductor material (i.e., nanowires, graphene, etc.) are thin enough (e.g., less than about 30 nm for light and less than about 100 nm for e-beam) that the e-beam/light used in this step can pass right through, thus effectively cross-linking the patternable dielectric both above and below the semiconductor material. The e-beam/light has no effect on the semiconductor material.

By contrast, in conventional processes a planarizing dielectric is often used to surround the source and drain regions, and contacts are formed through the planarizing dielectric down to the source and drain regions. If for instance an etching process, such as reactive ion etching (RIE), was employed in that conventional process in an attempt to expose the underside of the source and drain regions (as will be done in the present process, see following description) the RIE would most certainly cause damage to the semiconductor material in the process. For instance, in the present example, breakage of the nanowires might (undesirably) occur.

Another notable advantage to the present process is, since a single exposure is used to cross-link the patternable dielectric (as just described), then the contacts (to be formed as described below) will be perfectly aligned to one another along the top/bottom and possibly also the sides of the source and drain regions. See, for example, FIGS. 13-15 which illustrate the present all-around contacts being formed to the top, bottom and two sides of the source and drain regions. See also, FIG. 19 which illustrates the present all-around contacts being formed to the top, bottom and one side of the source and drain regions.

Figure 10:
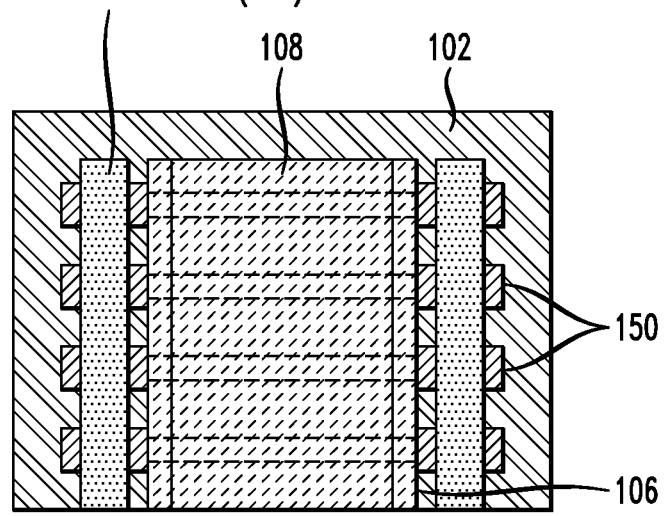
FIG. 10 is a top-down diagram illustrating the structure of FIG. 9 according to an embodiment of the present invention.

Following the developer wash, an anneal may optionally be used to harden the dummy contacts 260. According to an exemplary embodiment, the anneal is performed at a temperature from about 300° C. to about 1,000° C. in nitrogen ($N_2$) for a duration of from about 5 minutes to about 30 minutes. The exact annealing temperature depends on the details of the device. For example, graphene can sustain high annealing temperatures in excess of 1,000° C., but a III-V semiconductor such as InGaAs would typically be annealed at a temperature of below 400° C. Other factors such as dopant diffusion may also limit the annealing temperature. The hardened dielectric has properties similar to thermal silicon dioxide ($SiO_2$) (thermal oxide), and a similar etch rate in diluted hydrofluoric acid (HF) is achieved for the higher range of annealing temperatures. As an example, the etch rate of hardened HSQ that was annealed at 900° C. is about 12 nanometers per minute (nm/min). For reference the etching rate of thermal oxide is from about 2 nm/min to about 3 nm/min in 100:1 diluted HF. This annealing/hardening step has the effect of dissociating Si—H bonds and increasing Si—O bonds in the patternable dielectric. See, for example, Liou et al., "Effect of curing temperature on the mechanical properties of hydrogen silsesquioxane thin films," Thin Solid Films 335, pgs. 186-191 (1998), the contents of which are incorporated by reference herein. It is further noted that the hardening of HSQ can also be achieved by UV-curing and by plasma curing, or by a combination of these methods. FIG. 10 is a top-down diagram illustrating the structure of FIG. 9.

A planarizing dielectric 270 is then deposited onto the structure, surrounding the dummy contacts 260 and covering the gate and semiconductor material. See FIG. 11. The planarizing dielectric 270 is used to planarize, i.e., to reduce the surface topography. The planarizing dielectric 270 has to be thick enough to allow planarization by CMP. According to an exemplary embodiment, planarizing dielectric 270 is made up of a low-k dielectric material (such as LKD 1037 made by JSR Corporation, Tokyo, Japan) and is from about 50 nm to about 400 nm thick. Following deposition, the low-k dielectric material may be polished using, e.g., chemical mechanical polishing (CMP), so as to expose a top of the dummy contacts 260. See FIG. 11.

Figure 11:
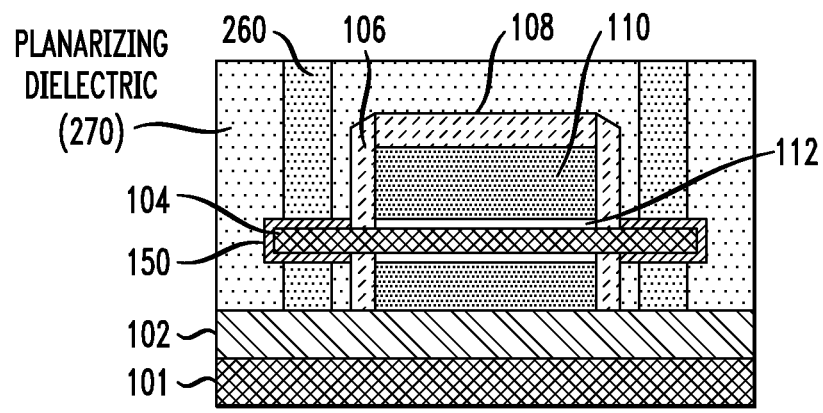
FIG. 11 is a cross-sectional diagram illustrating a planarizing dielectric having been deposited onto the structure, surrounding the cross-linked dielectric according to an embodiment of the present invention.
Figure 12:
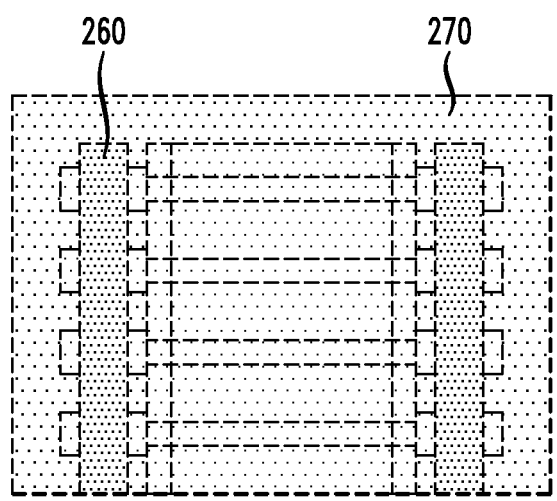
FIG. 12 is a top-down diagram illustrating the structure of FIG. 11 according to an embodiment of the present invention.
Figure 13:
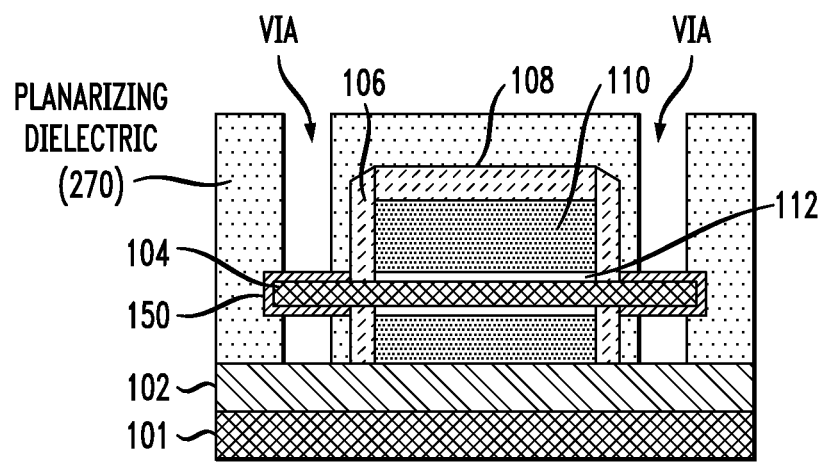
FIG. 13 is a cross-sectional diagram illustrating the cross-linked dielectric having been removed, selective to the planarizing dielectric, resulting in a via in the planarizing dielectric that surrounds the top, bottom and possibly the sides of the source and drain regions according to an embodiment of the present invention.

FIG. 12 is a top-down diagram illustrating the structure of FIG. 11. The structures underlying the planarizing dielectric 270 are shown with dashed lines. As also shown in FIG. 12, the tops of the dummy contacts 260 are exposed in the planarizing dielectric 270.

The dummy contacts 260 can then be removed, selective to the planarizing dielectric 270, resulting in vias being formed in the planarizing dielectric 270 that surround the source and drain regions. See FIG. 13. The dummy contacts are selectively etched out for example by the use of a wet etch, such as diluted HF. It is notable that in this example, the vias extend around both sides of the source and drain regions. Thus, when the vias are filled with a contact metal (as described below), the resulting source/drain contacts are formed to the top/bottom and sides of the source/drain regions. This is not however the only configuration possible. According to the present techniques, what is desired is that the source/drain contacts are formed to the top and bottom of the source/drain regions. According to the present techniques, this may be accomplished in a number of different ways. Forming the source/drain contacts to the top and bottom of the source/drain regions may be accomplished as shown for example in FIG. 13 where the vias expose both sides of the source drain region (so as to permit the contact metal to be deposited below the source/drain regions). Another possible way to do this would be to expose only one side of source/drain regions, thus allowing the contact metal to be deposited both on top and below the source drain regions. The source/drain contacts formed in that case would contact the top, bottom and only one side of the source/drain region. This alternative exemplary embodiment is shown illustrated in FIG. 19, described below.

Figure 14:
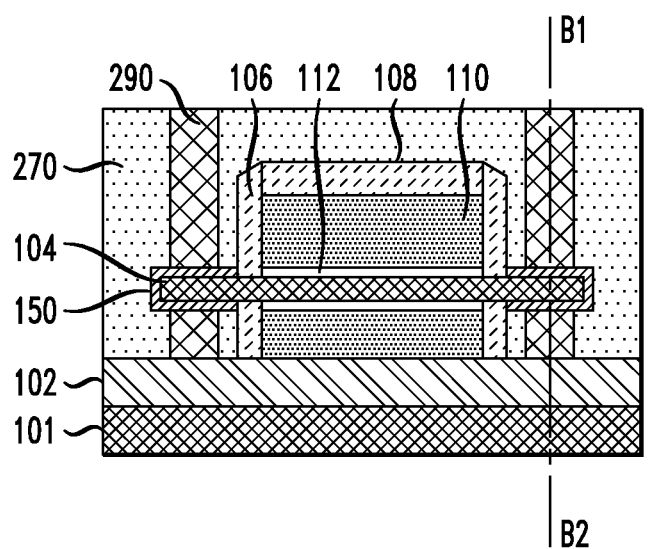
FIG. 14 is a cross-sectional diagram illustrating the vias having been filled with a contact metal resulting in metal filled vias according to an embodiment of the present invention.

The vias may then be filled with a contact metal, such as tungsten (W), copper (Cu) and/or titanium (Ti), resulting in metal filled vias that extend through the planarizing dielectric. The via filling can be done by methods such as chemical vapor deposition (CVD) of metals, and/or metal plating. These metal filled vias are what was referred to above as replacement contacts since they replace the dummy contacts 260 (i.e., placeholders) which were removed to form the vias. The structure with replacement contacts 290 having been formed is shown in FIG. 14. Since the vias (formed in the previous step) surround the source and drain regions, the replacement contacts 290 will likewise surround the source and drain regions (i.e., the replacement contacts 290 will contact a top, a bottom and sides of each source and drain region of the device). Replacement contacts configured in this manner are what is being referred to as an all around contact.

Figure 15:
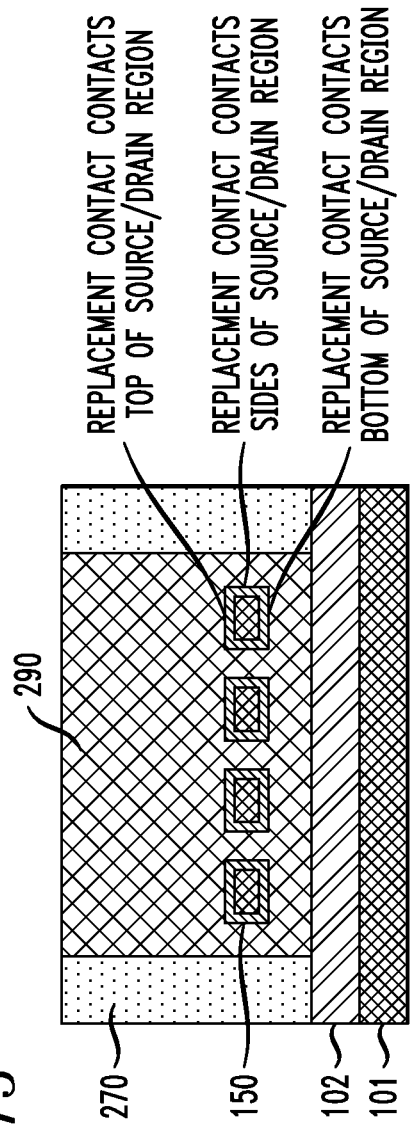
FIG. 15 is a cross-sectional diagram illustrating a cut through one of the metal filled vias of FIG. 14 according to an embodiment of the present invention.

A cross-sectional cut, i.e., through line B1-B2, of the structure of FIG. 14 is shown in FIG. 15. FIG. 15 illustrates how the replacement contacts 290 (i.e., the source and drain contacts) surround each of the source and drain regions. Namely, FIG. 15 illustrates how, in the nanowire FET example, the replacement contacts contact the top, bottom and sides of each source and drain region of the device. An illustration depicting the replacement contacts (i.e., the source and drain contacts) surrounding the source and drain regions in an exemplary embodiment wherein the semiconductor material is graphene is provided in FIG. 18, described below.

Figure 16:
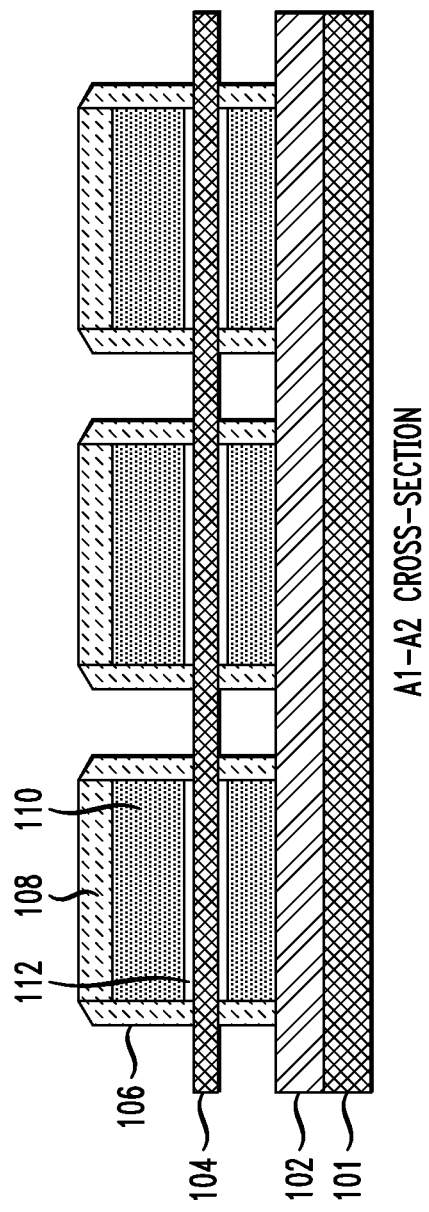
FIG. 16 is a cross-sectional diagram illustrating an exemplary starting structure for the present source and drain contact formation process wherein multiple devices are present side by side on a wafer according to an embodiment of the present invention.
Figure 17:
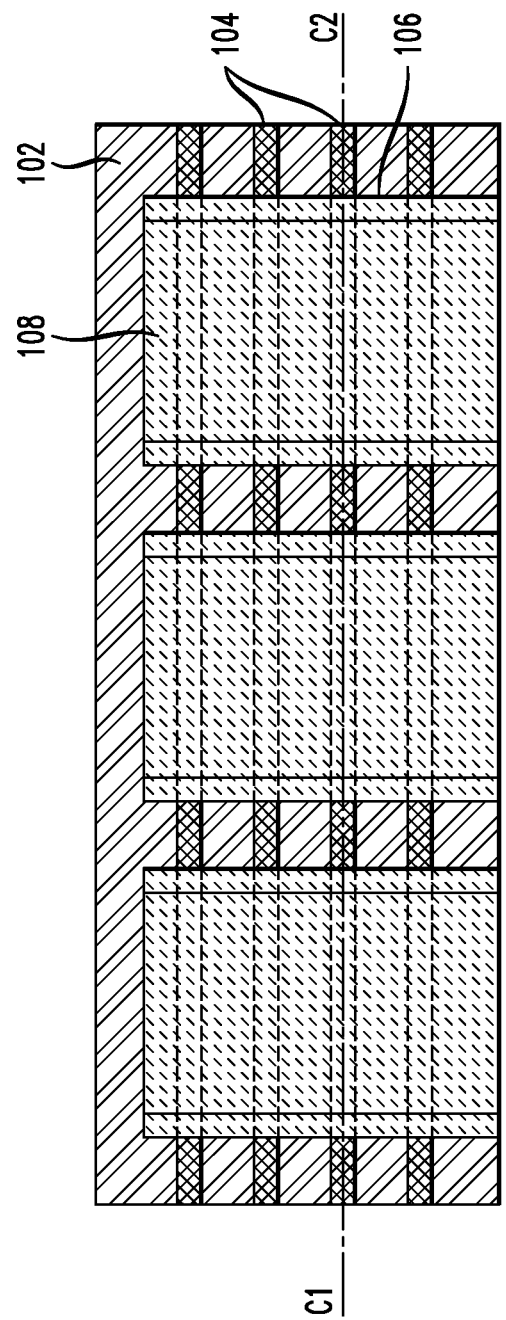
FIG. 17 is a top-down diagram illustrating the exemplary starting structure of FIG. 16 according to an embodiment of the present invention.

It is notable that the above-described example illustrates the formation of a single device. This was done merely for ease and clarity of description with the understanding that one of ordinary skill in the art would be able, given the instant description, to apply those teachings in the context of fabricating multiple devices on the same wafer. Namely, as provided above, the present techniques are applicable in the same manner as described to forming multiple devices, side by side, on a wafer. An exemplary starting structure for such a multi-device process (again illustrated in the context of a nanowire FET) is shown in FIG. 16. Note that what is shown in FIG. 16 and the starting structure shown in FIG. 1 (for example) are identical, except that in FIG. 16 multiple devices are being formed. The steps then illustrated and described in conjunction with the description of FIGS. 1-15, above, would be identical (and performed simultaneously) for each device being formed on the wafer. Given the present teachings, the implementation of these techniques would be within the capabilities of one of skill in the art. As will be apparent from reference to the top-view of the device shown in FIG. 17, FIG. 16 is a cross-sectional cut through line C1-C2 of a nanowire FET device. Further, since FIGS. 16 and 17 merely illustrate multiple instances of the same device elements as those shown, e.g., in FIG. 1, the same numbering is employed in FIGS. 16 and 17 as in FIG. 1, and is meant to refer to the same elements in each of the figures. FIG. 17 is a top-down diagram illustrating the structure of FIG. 16.

Figure 18:
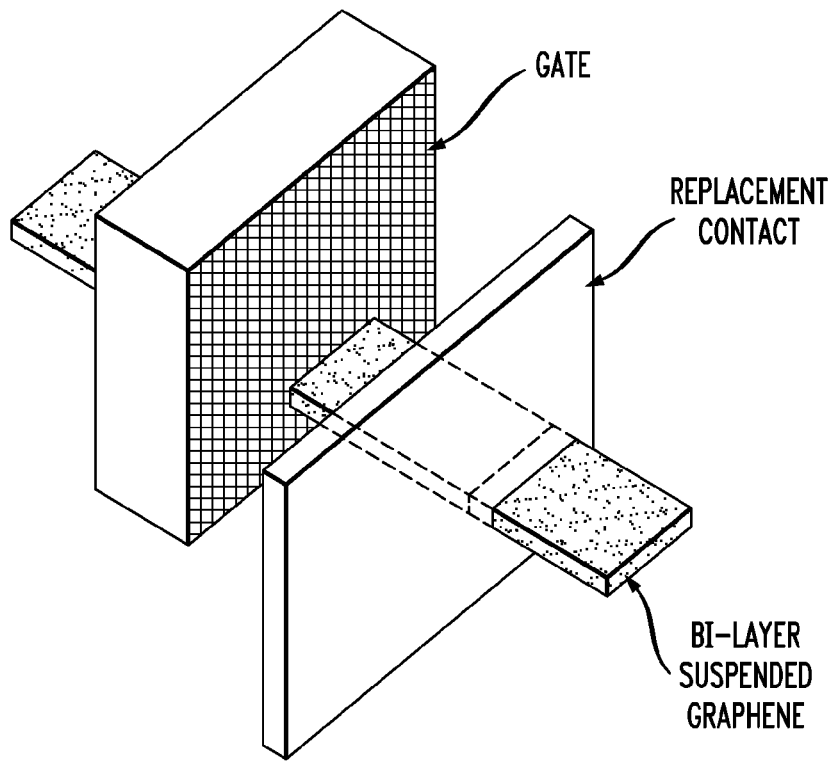
FIG. 18 is a three-dimensional diagram illustrating a device structure wherein the semiconductor material employed is graphene and wherein replacement (source/drain) contacts have been formed to the graphene using the present techniques according to an embodiment of the present invention.

As provided above, while the replacement contact process has been described by way of reference to the fabrication of a nanowire FET, the present techniques are more generally applicable to any device structure where the source and drain regions are displaced/suspended over the underlying substrate. FIG. 18 is a three-dimensional diagram illustrating source/drain contacts having been formed (using the present replacement contact process) to a suspended graphene film.

Figure 19:
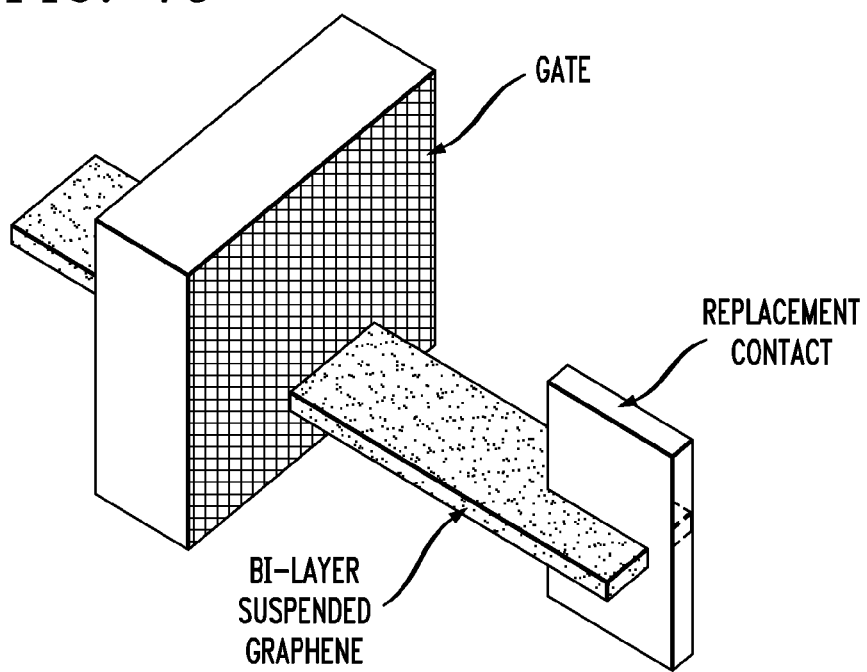
FIG. 19 is a three-dimensional diagram illustrating the present replacement contact having been formed to a top, bottom and one side of the source/drain regions according to an embodiment of the present invention.

As described above, the all-around contact configurations produced and described herein include embodiments wherein the replacement contacts are made to the top, bottom and both sides of the source/drain regions. See, for example, FIGS. 13-15, described above. Alternatively, the present all-around replacement contacts can be formed to the top, bottom and only one side of the source/drain region. This exemplary embodiment is shown illustrated in FIG. 19. As shown in FIG. 19, in this case, the replacement contact surrounds the source/drain regions by way of an end side (and the top and bottom) rather than two adjacent sides. FIG. 19 is an example of a structure where the replacement contact does not fully surround the source or drain. In the case shown in FIG. 19, the replacement contact resembles the "jaw of a clamp." The replacement contact does not need to be perpendicular to the gate as shown in FIG. 19, but can also be made to be parallel to the gate as shown in FIG. 18 for a fully surrounding contact. This alternative configuration involves changing the configuration/location of the patternable dielectric in the above-described process flow which, given the detailed description provided above, could be implemented by one of skill in the art.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field-effect transistor (FET) device, comprising:
   a substrate;
   a semiconductor material over the substrate;
   at least one gate on the substrate surrounding a portion of the semiconductor material that serves as a channel region of the FET device, wherein portions of the semiconductor material extending out from the gate serve as source and drain regions of the FET device, and wherein the source and drain regions of the FET device are displaced from the substrate;
   a planarizing dielectric on the device covering the gate and the semiconductor material; and
   contacts which extend through the planarizing dielectric and surround the source and drain regions of the FET device.

2. The device of claim 1, comprising multiple gates.

3. The device of claim 1, wherein the semiconductor material comprises a plurality of silicon nanowires.

4. The device of claim 3, wherein the substrate comprises a silicon substrate and a buried oxide (BOX) on the silicon substrate, and wherein the nanowires are formed in a silicon-on-insulator (SOI) layer on the BOX.

5. The device of claim 1, wherein the semiconductor material comprises graphene.

6. The device of claim 3, further comprising:
   a silicide on the source and drain regions of the FET device.

7. The device of claim 1, wherein the planarizing dielectric comprises a low-k dielectric material.

8. The device of claim 1, wherein the contacts comprise one or more of tungsten, copper and titanium.

9. The device of claim 1, further comprising:
   spacers on opposite sides of the gate.

10. The device of claim 9, wherein the spacers comprise a nitride material.

11. The device of claim 1, wherein the contacts contact a top, a bottom and sides of each of the source and drain regions of the FET device.

12. The device of claim 1, wherein the gate comprises a metal gate.

13. The device of claim 1, wherein the gate comprises a doped polysilicon gate.

14. The device of claim 1, further comprising:
   a gate dielectric separating the gate from the semiconductor material.

15. The device of claim 1, wherein the contacts contact a top, a bottom and at least one side of each of the source and drain regions of the FET device.

* * * * *